Figure 1:
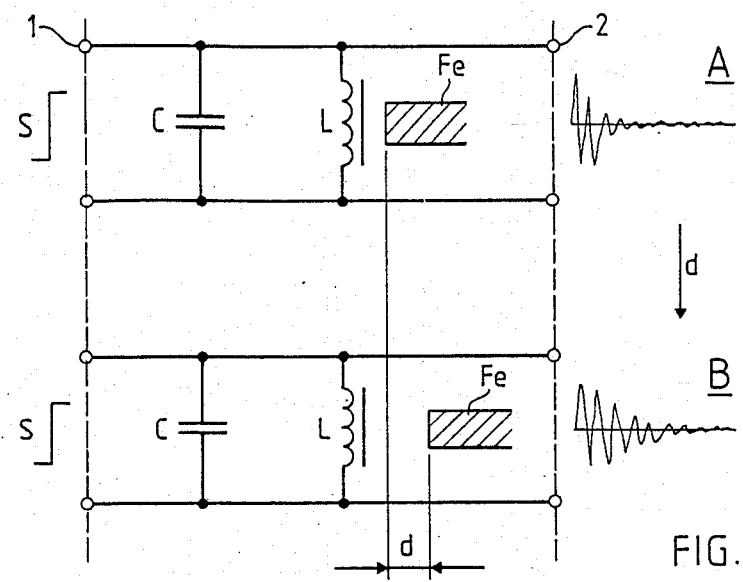

United States Patent [19]

Weisshaupt

[11] Patent Number: 4,843,259

[45] Date of Patent: Jun. 27, 1989

[54] PROCESS FOR THE NON-CONTACTING DETECTION OF EDDY CURRENT-INDUCED BODIES, PARTICULARLY METAL OBJECTS, AS WELL AS TO SENSORS BASED ON THE PROCESS

[75] Inventor: Bruno Weisshaupt, Frauenfeld, Switzerland

[73] Assignee: Baumer Electric AG, Frauenfeld, Switzerland

[21] Appl. No.: 113,147

[22] Filed: Oct. 26, 1987

[30] Foreign Application Priority Data

Oct. 29, 1986 [CH] Switzerland .................... 4289/86

[51] Int. Cl.$^4$ .................. H03K 17/90; H03K 17/687; G01N 27/00; G01B 7/14

[52] U.S. Cl. ................................. 307/308; 307/309; 307/580; 307/227; 328/5; 331/65; 324/207; 324/234

[58] Field of Search ............... 307/308, 309, 227, 580; 328/5; 331/65; 324/207, 234

[56] References Cited

U.S. PATENT DOCUMENTS 3,350,660 10/1967 Engdahl et al. ................. 331/65
3,509,469 4/1970 Strange ........................ 328/5
4,719,362 1/1988 Nest et al. ..................... 331/65

FOREIGN PATENT DOCUMENTS 2618231 10/1977 Fed. Rep. of Germany ......... 328/5

OTHER PUBLICATIONS

Sensenbaugh, "Proximity Detector", IBM Technical Disclosure Bulletin, vol. 13, No. 18, Jan. 1971, pp. 2230-2231.

Primary Examiner—Stanley D. Miller
Assistant Examiner—Trong Quang Phan
Attorney, Agent, or Firm—Walter C. Farley

[57] ABSTRACT

The process for the detection of an eddy current-induced body in the action range of an inductive resonant circuit component (L) uses in place of a continuous operation and detection of the current change, a network containing a resonant circuit (L,C) is briefly excited with an electric function and the system response of the network is evaluated. The proximity sensor is constituted by an oscillatable network (L,C) operated on the input side with a function generator and, on the output side, the system response is investigated with an evaluation circuit.

13 Claims, 6 Drawing Sheets

FIG. 2A
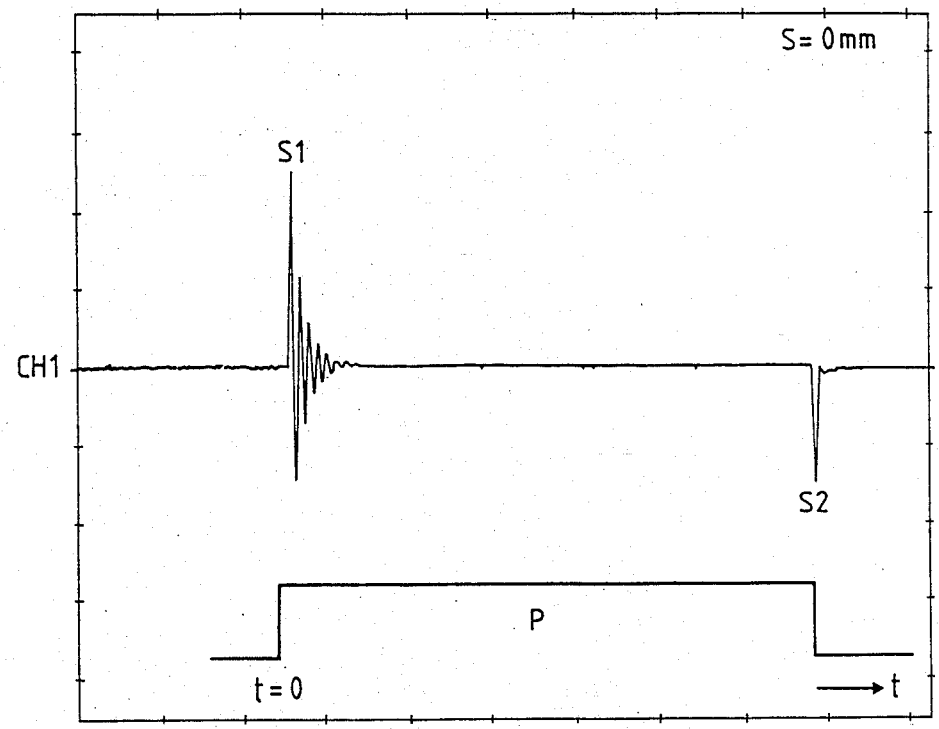
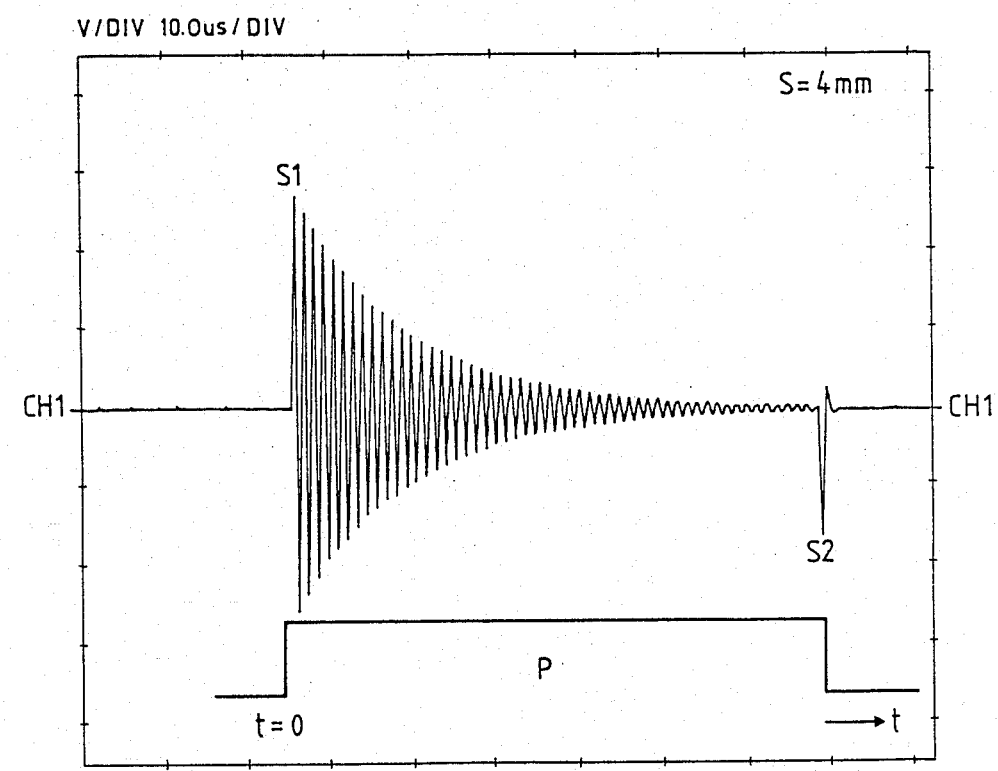
FIG. 2B

PROCESS FOR THE NON-CONTACTING DETECTION OF EDDY CURRENT-INDUCED BODIES, PARTICULARLY METAL OBJECTS, AS WELL AS TO SENSORS BASED ON THE PROCESS

The invention relates to the field of sensor technology and specifically to a process for the non-contacting detection of eddy current-induced bodies, especially metal objects, as well as to sensors based on this process, such as position sensors, proximity initiators, proximity switches, etc.

Contact-free proximity sensors, proximity initiators and proximity switches for detecting the presence of a metal body and/or for the detection of the spacing of such a metal body are based on the principle of detuning an oscillator by damping as soon as a metal object is located in the radiated oscillator field. These circuits are generally analog circuits and, for completely satisfactory operation the analog oscillator circuit must be housed in the sensor component where the oscillator coil is located. This inter alia leads to miniaturization problems, quite apart from the fact that the feeding of the switching signals to the means to be switched requires multiwire lines.

As is known, analog circuits have their characteristic limitations and disadvantages, in particular the temperature dependence of oscillator circuits in general and therefore proximity initiators in particular. The precision of such a proximity initiator is consequently very dependent on the thermal stability of the immediate environment in which is functioning the more or less temperature-dependent analog circuit.

In rapid dynamic operation, the inertia of the analog-constructed oscillator system becomes increasingly noticeable. Here again limits have been reached and it is very difficult to extend these.

In order to maintain the desired or required precision with respect to the temperature sensitivity, particularly of a proximity switch, generally a procedure is adopted for obtaining high temperature-compensated circuits (temperature insensitivity). This procedure leads to a disproportionate increase in costs and for an effective improvement to the dynamics, analog auxiliary switches for speeding up the oscillation process within certain limits are also known.

Such relatively complicated measures for improving the reliability, precision, etc. eliminates the initial advantage of analog circuits, namely the possibility of obtaining a dampable oscillator circuit suitable for switch and sensor purposes with relatively limited circuitry expenditure and is replaced by considerable extra circuitry expenditure, which ultimately finds its limit in the most highly developed circuits.

A starting point for a solution without an oscillator, as proposed in IBM-TDB, vol. 13, No. 8, January 1971, pp 2230–2231, was never commercially realized, because vital significance was attached to the disadvantages of a relatively high circuitry expenditure. The proximity detector described therein has a resonant circuit, which is briefly excited by means of an electric pulse, the pulse response being summed via an integrator until the integral, which is compared with the signal of a reference coil and its sequential circuit in a comparator, indicates at the output of the comparator the presence or absence of a damping body. This detector is unable to detect movement sequences of a damping body or to provide more information. The very complicated detection circuit is also unacceptable from the costs standpoint for a single sensor, quite apart from the fact that through the evaluating integration, this non-analog solution also behaves in a relatively inert manner, as is the case in the known proximity switches.

The invention is directed at a new procedure in the field of inductive position sensors, proximity sensors, switches, initiators, etc., with the aim of omitting the energy-inert oscillator, thereby obtaining a much faster, less temperature-dependent sensor which, for achieving high precision, requires very small circuitry expenditure and is directly suitable for any digital further processing of the sensor signal, preferably without additional interface circuits.

This objective is achieved by the invention given in the claims, which gives a process for the detection of eddy current-induced bodies, e.g. metal bodies, by means of oscillatable components and teaches the use of this process for producing precisely functioning position sensors.

The inventive idea is based on the concept that if in place of the conventional continuous operation of an oscillatable circuit or component conventionally used with proximity switches, discontinuous operation is chosen and in place of the energy change in the continuous energy flow of said operating mode, the system response is investigated, so that in simple, time-direct manner the influence of the environment is rendered visible, which is not possible when an energy current is morely disturbed by external circumstances (damping bodies). A system response is obtained by exciting and automatically smoothing (decay) and as the system is coupled to the physical environment, a system response will incorporate this environment of the system in its response. Therefore conclusions regarding said environment can be drawn from the system response.

If e.g. the pulse response of a LC system is so evaluated that this response varies as a function of time and therefore as a function of the quality of L and therefore also as a function of the spacing of an eddy current-induced body, then this evaluation can be directly used for distance detection of an inductance coil with respect to a body such as a ferromagnetic body. Such a process for detecting an eddy current-induced body in the field of action of an inductive element of a resonant circuit, which is briefly excited with an electric function and the system response is evaluated, is brought about according to the invention by a time-continuous, quantitative measurement of the step response of a brief excitation, for retaining the instantaneous image or picture of the locus of the eddy current-induced body and by the evaluation of the signal change over a sequence of excitations and their step responses as an overall picture, a real time measurement of the damping body state is performed over part of the movement of the eddy current-induced body.

Thus, pulse operation is possible of an inductive proximity switch rationally constructed from the circuitry standpoint and this is also appropriate as a result of the given reaction speed and the given precision. The subject matter of the following discussion is the derivation of such a dedicated pulse operation through the special evaluation of the pulse response and the provision of a circuit example for a pulse-operated proximity switch or proximity initiator respectively.

The subject matter of the discussion is illustrated by the following drawings, wherein show:

FIG. 1 In parts A and B an electrical network for investigating the step responses as a function of the spacing of an eddy current-induced body.

FIGS. 2A and 2B Typical step responses of an arrangement, in which a body is directly adjacent to the inductance coil (large influence) and a typical step response of an arrangement in which such a body is relatively remote (small influence).

Figure 3:
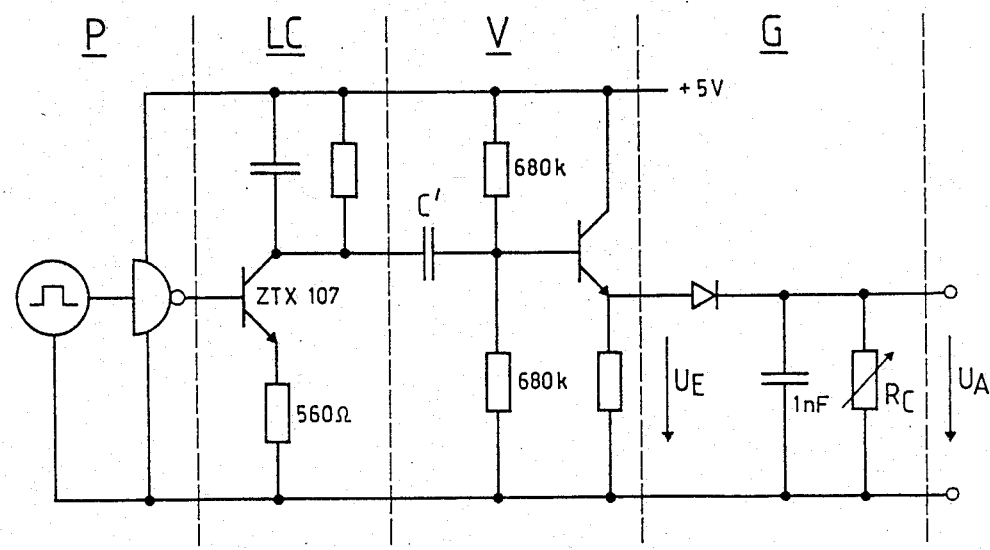

FIG. 3 A basic circuit for a proximity initiator using the peak value rectification of the step response.

Figure 4:
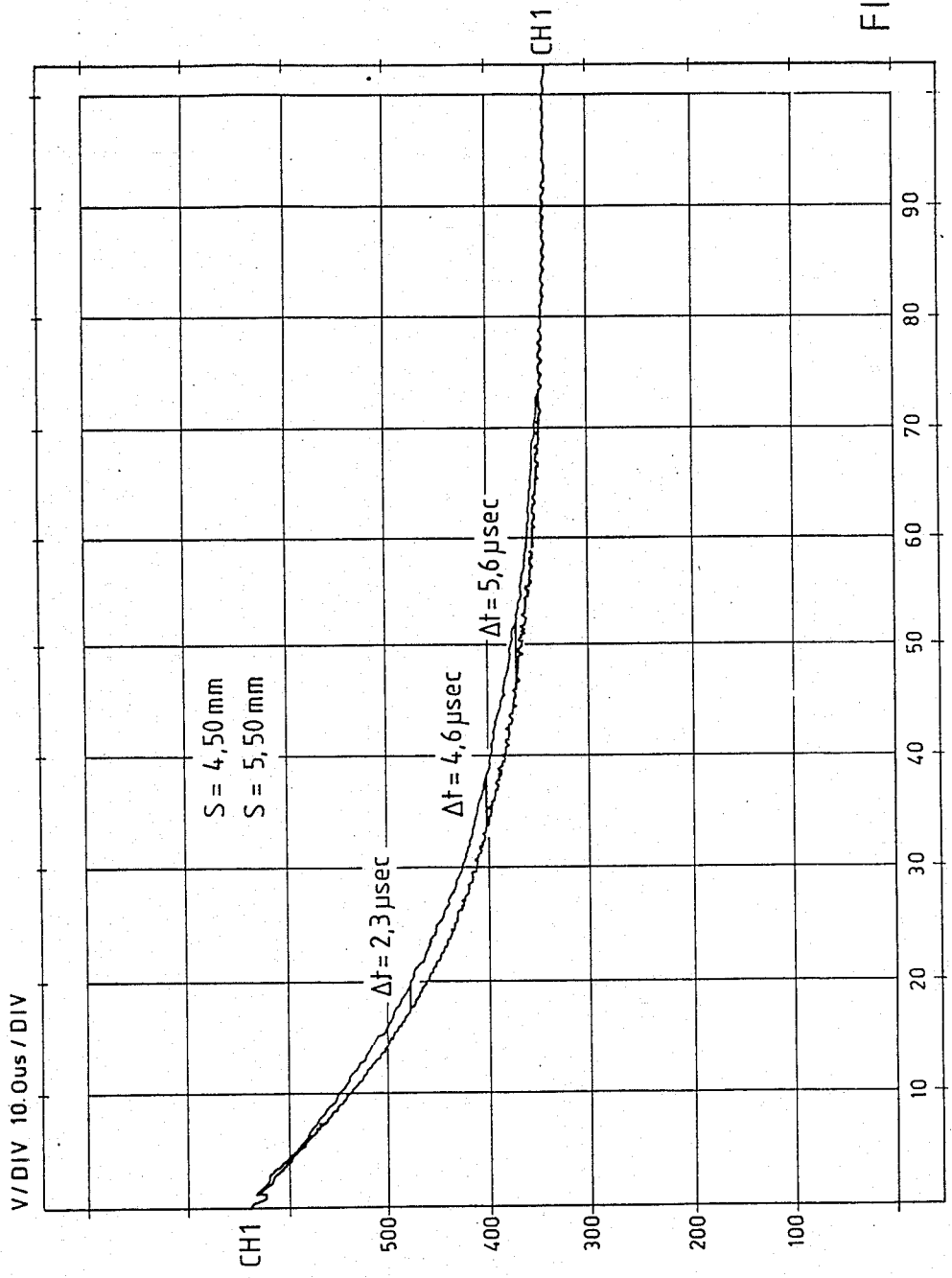

FIG. 4 Two different starting functions dependent on the distance between the sensor coil and an eddy current-induced body.

Figure 5:
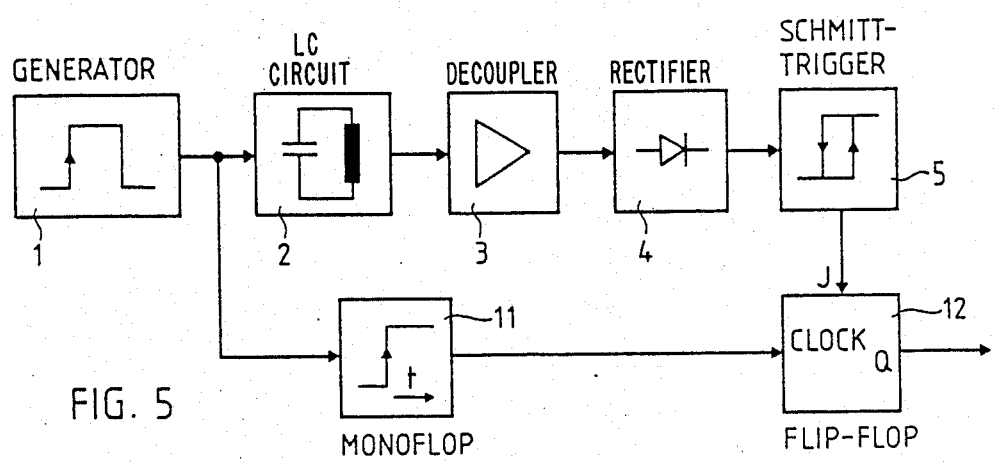
Figure 6:
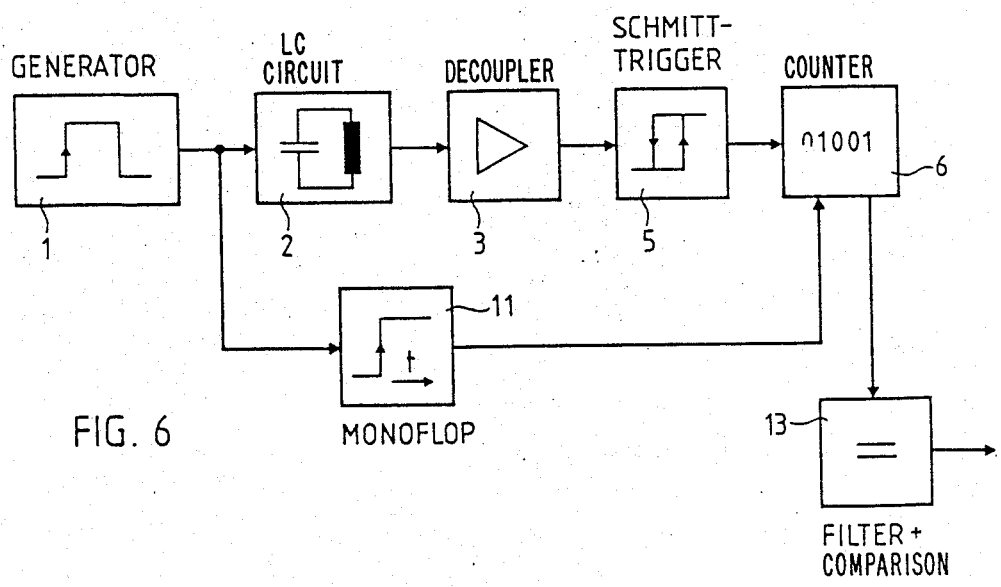

FIGS. 5 and 6 Two examples of proximity initiators in the block circuit diagram.

Figure 5A:
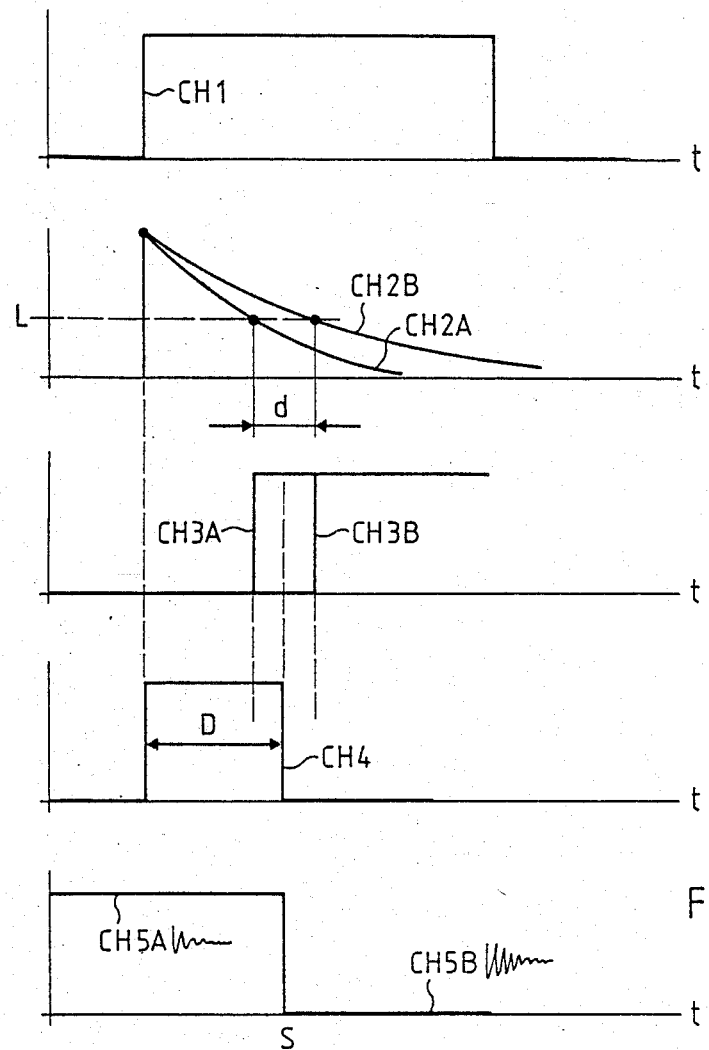

FIG. 5A The time patterns of signals of a circuit according to FIG. 5.

Figure 7:
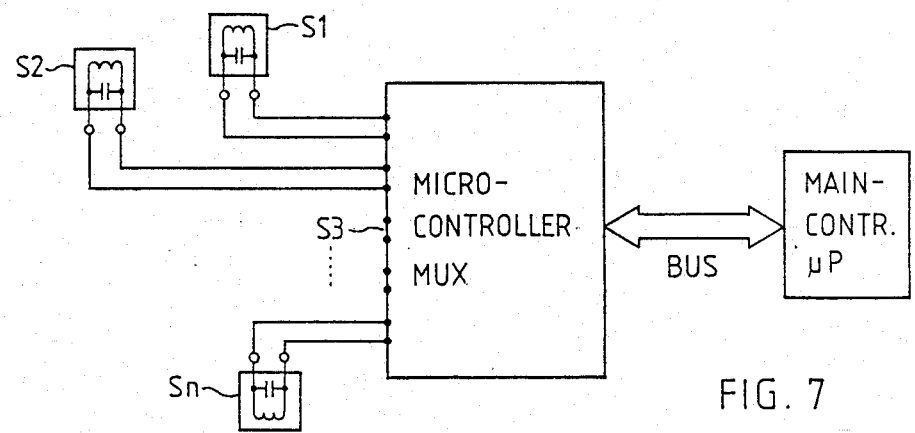

FIG. 7 In a block circuit diagram a possible use of the process in multiplex operation.

Figure 8:
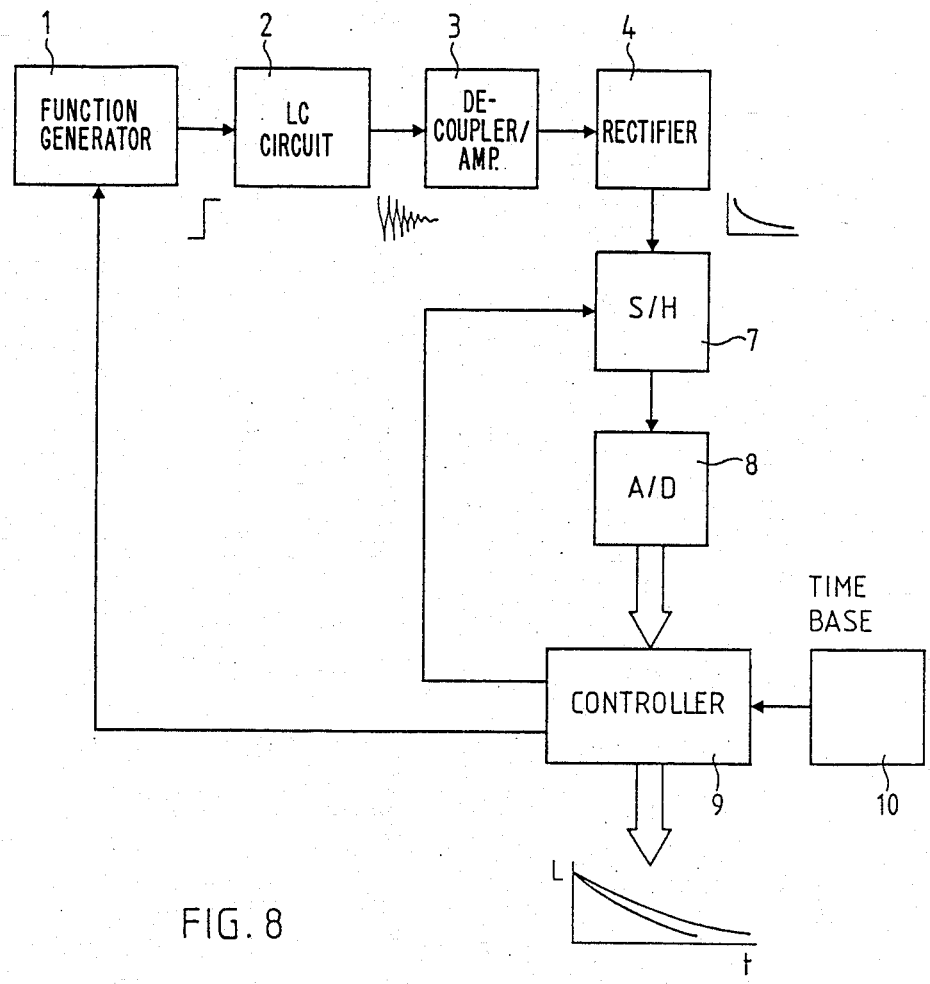

FIG. 8 shows an embodiment of a proximity initiator in general representation form.

FIG. 1 shows the basic principle of the inventive procedure. A LC-parallel resonant circuit with an iron-containing coil, e.g. a ferrite (pot) core, as used in inductive proximity sensors, is shown in A with a damping body Fe positioned very close to the coil and in B with a damping body Fe more remote by the distance d. The network receives a step function S at input terminals 1 and the step response is observed at output terminals 2. In both cases the expected decaying oscillation occurs, but it is much faster in the case of greater damping (A) than in case (B), which is more remote by the distance d and is less damped by this amount. As will be shown hereinafter, the configuration of the decaying envelope curve is a function of the damping or a function of the distance of the damping body Fe from coil L. The evaluation of the step response is consequently simultaneously the detection of the distance of a damping body from the resonant circuit.

Based on the two cases A and B of FIG. 1, FIGS. 2A and 2B show two actually measured voltage patterns, a step response on a measuring circuit, damped according to FIG. 1 with approximately 0 mm and 4 mm spacing from an eddy current-induced body. The initial peak S1 corresponds to the switch-on flank, side or edge of the step function P and peak S2 to the switch-off flank, side or edge of pulse function P. The step response is in the form of decaying oscillation between the two flanks.

At this point only the envelope or its decay function $A*\exp(-a*t/\tau)$ as a function of the distance or position of an eddy current-induced body is of interest here. The e.g. peak value rectifying circuit according to FIG. 3 supplies the desired function, which is represented in two damping bodies—sensor spacings of 4 and 5 mm in FIG. 4.

A pulse generator P acts on the oscillatable network LC, whose output signal is decoupled across a capacitor C' and amplified in an amplifier stage V. The amplified signal Ue at the output of amplifier stage V corresponds to the signal patterns according to FIGS. 2A and 2B. This signal is rectified in the following rectifier stage G with the possibility of trimming the decay quantity tau by means of a variable Rc. The output Ua corresponds to the signal patterns in FIG. 4, in which the step responses are shown as a function of two positions, merely differing by a millimeter, of a damping body from the sensor coil as a function of time (for determining the decay in tau) until the oscillation has faded away. On the ordinate are plotted the output voltages Ua in 100 mV/Div and on the abscissa the time in 10 μs/Div. The decay-delay $A*\exp(-a*t/\tau)$ as a function of damping can clearly be seen. The upper curve with the lower damping and therefore the weaker decay shows readily evaluatable differences compared with the curve below it with the more marked damping and therefore stronger decay. The difference corresponds to a one millimeter path difference of the damping body and transferred to the decay difference of approximately 5 μsec (as a function of the evaluation point) the damping body can easily be detected with a resolution of 0.2 mm.

In the case of the circuit shown in FIG. 3 for a peak value rectification for obtaining an evaluatable envelope, it must be borne in mind that tau does not become too small, because then Ua does not adequately follow the peak values of Ue and this is accompanied by strong oscillation. If tau is too large, there is a risk of the discharge curve of the RC-network being flatter than Ue (max). The correct position can be adjusted using the variable resistor Rc.

It is obvious that the presently discussed step response evaluation by means of peak value rectification is not the sole possibility. In principle it is possible to use all methods used for evaluating or measuring decays and in particular the difference between them. However, for proximity initiators preference is given to methods close to real time operation. For proximity sensors in general all adequate methods can be used which are the most appropriate for the particular applications.

FIGS. 5 and 6 show in block diagram form two examples of possible embodiments of a proximity initiator (proximity sensor) based on the basic configuration according to FIG. 3. It is pointed out that the physical sensor part at the use front can be limited in the represented solution to the inductance coil alone. The capacitor supplementing the resonant circuit can be housed in a spatially separated amplifier network with decoupling and rectification. The actual physical measurement at the coil is a quality factor or Q measurement of the inductance coil influenced by the eddy current-induced body. With a single function generator, e.g. a pulse generator, input functions can be applied to entire groups of coils and also entire groups of proximity initiators can be evaluated with an evaluation means evaluating the output voltage. This permits a computer-controlled automatic operation of spatially randomly arranged sensors, e.g. on a robot.

The aforementioned decentralization is an important aspect and when consideration is given in connection with these embodiments to a proximity initiator with input generator and with an output evaluation circuit, this applies to an individual, fully functional initiator, switch, sensor, etc., which can also be realized in groups in the aforementioned manner and in this form, as a result of the much higher reaction speed than with conventional oscillator circuits, permits multiplex operation, in which the individual sensors are no slower than the presently known, individually evaluated, inductive proximity initiators.

FIG. 5 shows a proximity sensor with a pulse generator, which oscillates with a positive pulse flank, edge or side on one action path of an LC circuit and on the other action path sets a monoflop with t=0. The positive pulse side forces a step response in the resonant circuit, which is decoupled, amplified and rectified. The partial evaluation circuit is in this case a Schmitt trigger, which in the case of a fixed voltage threshold switches through and applies a clearly defined input level to a flip-flop timed with the monoflop. The output signal of the flip-flop appears later the further a damping body is positioned from the coil, e.g. delayed by approximately 5 μsec per millimeter distance from the sensor. As the precision of a proximity initiator must not only have a good path resolution, but also a comparably good, or even better time resolution, requirements or demands are also made on the repetition frequency. The discussed solutions permit a kicking frequency of the resonant circuit between 5 and 50 kHz. Thus, high speeds of a damping body can be adequately well resolved and this reveals one of the advantages of the proposed digital solution compared with the conventional analog solutions, because an approximately ten times faster sensor can be obtained.

FIG. 5A shows signal patterns in the circuit according to FIG. 5. CH1 is the pulse configuration of the pulse generator with an excitation flank at point t=0, CH2 is the signal pattern of the step response after the rectifier, CH3 is the signal at the J input of the flip-flop, the K input being reverse with respect thereto, CH4 is the strobe clock with monoflop to flip-flop (positive flank active) and CH5 is the output signal at the flip-flop output Q. All signals change e.g. with a frequency of 10 kHz. Based on the previous drawings with step responses, a more damped decay A and a less damped decay B are shown. The Schmitt trigger threshold is designated L. For both decays the output signal CH3 is switched in time-differing manner on the Schmitt trigger. This difference corresponds to the location difference d of the damping body. The monoflop retains its unstable state of signal CH4 for a time t, which corresponds to the switching spacing D, whose negative flank establishes the "switching point" S. The output signal CH5 at the Q terminal remains stationary high or low for as long as there is a stationary damping state. On passing from condition A to B or B to A the output signal of the flip-flop alters into the other state. Thus the switch can detect the damping state before and after a fixed switching point S shown by the indication of the two decays at signal states CH5A and CH5B.

FIG. 6 shows a similar circuit proposal but in place of the envelope produced by rectification, individual oscillations are directly detected by means of a Schmitt trigger. The obtaining of the necessary voltage threshold is also dependent on the time and damping body position. In a following counter settable by the monoflop, oscillations are countered which exceed the voltage threshold. The closer the damping body is brought to the coil, the less they will be (cf. e.g. FIG. 4 at point 400 mV and between 30 to 40 μsec). The counter reading can then be fed to a comparator. The embodiment according to FIG. 6 therefore corresponds to a completely digitized, discrete solution of the problem which, without difficulty, can be integrated into a customer-specific integrated circuit.

FIG. 7 shows in block diagram form an embodiment of the aforementioned multiplex operation of the pulsed sensors S1, S2 ... Sn. In a realization of the decentral group sensor solution, the pulse generation and/or signal detection is taken over by a microcomputer for all the in this case spatially randomly arranged sensors which, apart from the advantageously low circuitry expenditure for the individual basic sensors S1, S2 ... Sn (only the LC part at the front) leads to an advantageous possibility of data concentration or to a central sensor data processing in the microcomputer. The construction of a digital, e.g. serial interface BUS to a controlling process control uP can be integrated into the same microcontroller MUX. The block circuit diagram according to FIG. 7 is intended to show an application possibility, which cannot be realized in this way with existing proximity sensors. The field of use of this application form is e.g. in robot technology, mainly in connection with complex robots having a plurality of spatially random and therefore independently arranged, precise and very rapidly reacting sensors.

The process for the detection of an eddy current-induced body in the action range of an induction resonant circuit component (L) is described which, in place of a continuous operation and detection of the current change, excites a network containing a resonant circuit (L,C) with an electric function for a brief time and evaluates the system response of the network. An oscilatable network (L,C) is used as the proximity sensor and is operated on the input side with a function generator and investigates the system response on the output side using an evaluation circuit.

On the basis of the basic circuit diagram of FIG. 3 or the two examples of proximity initiators in the block circuit diagrams of FIGS. 5 and 6, FIG. 8 shows a proximity initiator with the evaluation of the movement state of the eddy current-induced body, which has penetrated the action range of the inductive resonant circuit (2) element. The resonant circuit, which is briefly excited by an electric function by function generator (1), gives the system response from the network, which is evaluated in the following circuits (3,4). With a continuous quantitative measurement of the step response following a brief excitation, it is possible to retain an instantaneous picture of the locus of the eddy current-induced body and through evaluating the signal change via a sequence of excitations and their step responses, it is possible to determine the overall picture over part of the movement sequence of said eddy current-induced body.

In a process in which the eddy current-induced body to be detected is detected in the action range of a coil as the resonant circuit element, the step response is amplified (3) and rectified (B) and the envelope of the step response is evaluated, as shown by the circuit of FIG. 8. In another process, in which the eddy current-induced body to be detected is detected in the action range of a coil as the resonant circuit element, the number and amplitude of a plurality of individual oscillations of the step response are evaluated. This is represented by the circuit according to FIG. 6 and in an embodiment of the performance of the process according to FIG. 8 the rectifier (4) is replaced by a Schmitt trigger and counters.

In the signal flow connecting on to the rectifier (or Schmitt trigger and counters), at the output follows a sample and hold circuit with a following A/D converter. A control circuit (controlle, microprocessor) by means of the generator and the sample and hold circuit (7) controls the excitations of the LC network and the sampling from the step response signal (cf. FIGS. 2A, 2B and 5A) and evaluates the signal samples with respect to the overall picture, as shown in FIG. 4. The controller is timed via a time base. FIG. 7 also shows the multisensor operation possible with this measure and in this the generator, decoupler, step response scanning, digital conversion and multiplex operation of the sensors takes place in the control box, which basically operates in the same way as the circuit according to FIG. 8. The time-succeeding excitation of the individual sensors prevents the reciprocal influencing of the sensors, such as occurs in the known oscillator solution.

I claim:

1. A process for the detection and location of a movable body in which eddy currents can be induced by a magnetic field when the body is within the field of an inductive resonant circuit component in a resonant circuit comprising the steps of
 exciting the inductive resonant circuit component with a short duration step function electrical pulse,
 measuring the quantitive response of the resonant circuit to the step function pulse,
 retaining the measurement as being representative of an instantaneous position of the body,
 repeatedly exciting the inductive resonant circuit component with step function pulses,
 measuring the response to each pulse, and
 retaining the response measurements representative of a sequence of instantaneous positions as a locus of points defining a path of movement of the body.

2. A process according to claim 1 wherein the inductive resonant circuit component is a coil and the step of measuring the response includes
 amplifying and rectifying the response to the step function pulse, and
 evaluating the envelope of the response signal.

3. A process according to claim 1 wherein the inductive resonant circuit component is a coil and the step of measuring the response includes
 amplifying the response to the step function pulse, and
 evaluating the number and amplitude of individual oscillations of the response signal.

4. A proximity sensor apparatus for detecting and locating a movable body in which eddy currents can be induced by a magnetic field when the body is within the field of an inductive resonant circuit component in a resonant circuit, the apparatus comprising
 a proximity sensor including a detector coil connected in operative resonant circuit relationship with a capacitor;
 function generator circuit means connected to said proximity sensor for exciting said resonant circuit with a short duration step function electrical pulse;
 amplifier circuit means connected to said resonant circuit for amplifying the response of said resonant circuit to said step function pulse;
 evaluation circuit means connected to the output of said amplifier circuit means for measuring the response of the resonant circuit to said step function pulse as being representative of an instantaneous position of the body; and
 control means connected to said function generator and said evaluation circuit means for controlling the operation of said function generator and said evaluation circuit means.

5. An apparatus according to claim 4 wherein said evaluation circuit means includes
 rectifier circuit means connected to receive the output of said amplifier circuit means for forming a response envelope;
 a sample and hold circuit connected to the output of said rectifier circuit means for sampling the response envelope; and
 digitizing circuit means connected to said sample and hold circuit for digitizing the sampled signals.

6. Use of the proximity sensor according to claim 4 as a proximity initiator.

7. Use of the proximity sensor according to claim 4 as a proximity switch.

8. Use of the proximity sensor according to claim 4 in a spacing measuring device.

9. A proximity sensor apparatus for detecting and locating a movable body in which eddy currents can be induced by a magnetic field when the body is within the field of an inductive resonant circuit component in a resonant circuit, the apparatus comprising
 a proximity sensor including a detector coil connected in operative resonant circuit relationship with a capacitor;
 function generator circuit means connected to said proximity sensor for exciting said resonant circuit with a short duration step function electrical pulse;
 amplifier circuit means connected to the output of said resonant circuit for amplifying the response of said resonant circuit to said step function pulse;
 evaluation circuit means connected to the output of said amplifier circuit means for measuring the response of the resonant circuit to said step function pulse as being representative of an instantaneous position of the body; and
 trigger circuit means responsive to the output of said function generator circuit means for producing a trigger signal; and wherein said evaluation circuit means includes
 level indicating circuit means responsive to said trigger signal to indicate the response level of said response signal.

10. An apparatus according to claim 9 wherein said level indicating circuit means includes a bistable circuit.

11. An apparatus according to claim 9 wherein said evaluation circuit includes a rectifier and a Schmitt trigger circuit.

12. An apparatus according to claim 9 wherein said evaluation circuit means includes a Schmitt trigger circuit and a counter connected to the output of said Schmitt trigger circuit.

13. An apparatus according to claim 9 wherein said coil has a ferrite core.

* * * * *